(12) United States Patent
Bormashenko et al.

(10) Patent No.: US 10,475,625 B2
(45) Date of Patent: Nov. 12, 2019

(54) PLASMA TREATMENT OF LIQUID SURFACES

(71) Applicant: Ariel-University Research and Development Company Ltd., Ariel (IL)

(72) Inventors: Edward Bormashenko, Ariel (IL); Yelena Bormashenko, Ariel (IL)

(73) Assignee: Ariel-University Research and Development Company Ltd., Ariel (IL)

( * ) Notice: Subject to any disclaimer, the term of this patent is extended or adjusted under 35 U.S.C. 154(b) by 140 days.

(21) Appl. No.: 14/819,631

(22) Filed: Aug. 6, 2015

(65) Prior Publication Data

US 2017/0036184 A1 Feb. 9, 2017

(51) Int. Cl.
| | |
|---|---|
| *B01F 17/00* | (2006.01) |
| *H01J 37/32* | (2006.01) |
| *H05H 1/46* | (2006.01) |
| *B05D 3/14* | (2006.01) |
| *B05D 1/00* | (2006.01) |
| *C10M 177/00* | (2006.01) |

(52) U.S. Cl.
CPC ........ *H01J 37/3244* (2013.01); *H01J 37/321* (2013.01); *H05H 1/46* (2013.01); *B01F 17/00* (2013.01); *B05D 1/62* (2013.01); *B05D 3/145* (2013.01); *C10M 177/00* (2013.01); *H05H 2001/466* (2013.01); *H05H 2240/10* (2013.01)

(58) Field of Classification Search
CPC ........ C10M 177/00; B05D 1/62; B05D 3/145; H01J 37/321; H01J 37/3244; H05H 1/46; H05H 2001/466; H05H 2240/10
See application file for complete search history.

(56) References Cited

U.S. PATENT DOCUMENTS

| | | | | |
|---|---|---|---|---|
| 3,847,652 A | * | 11/1974 | Fletcher | B01D 69/127 204/177 |
| 4,822,632 A | * | 4/1989 | Williams | A61M 5/31 219/121.36 |
| 5,846,649 A | * | 12/1998 | Knapp | B05D 1/62 428/334 |

(Continued)

OTHER PUBLICATIONS

Bormashenko et al. Colloids and Surfaces B: Biointerfaces 92 (2012) 367-371.*

(Continued)

*Primary Examiner* — Michael A Salvitti

(57) ABSTRACT

A method of decreasing a water contact angle and/or increasing a surface energy of a liquid is disclosed herein, the method comprising exposing the liquid to a plasma treatment. Further disclosed is a plasma-treated liquid exhibiting a decreased water contact angle and/or increased surface energy, compared to the water contact angle and/or surface energy, respectively, of a non-treated corresponding liquid. Methods for combining a first liquid and a second liquid, or for enhancing an adhesion between a liquid and a surface of another substance, the methods comprising exposing a liquid to plasma treatment, are further disclose herein, as well as a method of predicting an apparent contact angle of a liquid droplet on a surface of a substance.

23 Claims, 5 Drawing Sheets
(3 of 5 Drawing Sheet(s) Filed in Color)

(56) References Cited

U.S. PATENT DOCUMENTS

| | | | |
|---|---|---|---|
| 6,338,901 B1* | 1/2002 | Veerasamy | B05D 5/083 |
| | | | 428/336 |
| 6,461,334 B1 | 10/2002 | Buch-Rasmussen et al. | |
| 2011/0171426 A1* | 7/2011 | Chen | B05D 1/62 |
| | | | 428/141 |
| 2012/0160806 A1* | 6/2012 | Godyak | H01J 37/321 |
| | | | 216/61 |
| 2013/0001204 A1* | 1/2013 | Mistry | H01H 1/24 |
| | | | 219/121.59 |
| 2014/0076861 A1* | 3/2014 | Cornelius | B23K 10/003 |
| | | | 219/121.52 |
| 2017/0036184 A1* | 2/2017 | Bormashenko | H01J 37/321 |

OTHER PUBLICATIONS

Bormashenko et al. "Quantification and Physics of Cold Plasma Treatment of Organic Liquid Surfaces", arXiv Preprint arXiv: 1503.00425, Mar. 2, 2015.

Eifert et al. "Simple Fabrication of Robust Water-Repellent Surfaces With Low Contact-Angle Hysteresis Based on Impregnation", Advanced Materials Interfaces, 1(3): 1300138-1-1300138-5, Jun. 1, 2014.

Grinthal et al. "Mobile Interfaces: Liquids as a Perfect Structural Material for Multifunctional, Antifouling Surfaces", Chemistry of Materials, 26(1): 698-708, Oct. 14, 2013.

Hegemann et al. "Plasma Treatment of Polymers for Surface and Adhesion Improvement", Nuclear Instruments and Methods in Physics Research B, 208: 281-286, Aug. 31, 2003.

Morra et al. "On the Aging of Oxygen Plasma-Treated Polydimethylsiloxane Surfaces", Journal of Colloid and Interface Science, 137(1): 11-24, Jun. 30, 1990.

Multanen et al. "Hydrophilization of Liquid Surfaces by Plasma Treatment", Colloids and Surfaces A: Physicochemical and Engineering Aspects, 461: 225-230, Available Online Aug. 9, 2014.

Pascual et al. "Study of the Aging Process of Corona Discharge Plasma Effects on Low Density Polyethylene Film Surface", Journal of Materials Science, 43(14): 4901-4909, Published Online May 24, 2008.

Shillingford et al. "Fabrics Coated With Lubricated Nanostructures Display Robust Omniphobicity", Nanotechnology, 25(1): 014019-1-014019-12, Dec. 11, 2013.

Wong et al. "Bioinspired Self-Repairing Slippery Surfaces With Pressure-Stable Omniphobicity", Nature, 477(7365): 443-447, Sep. 22, 2011.

* cited by examiner

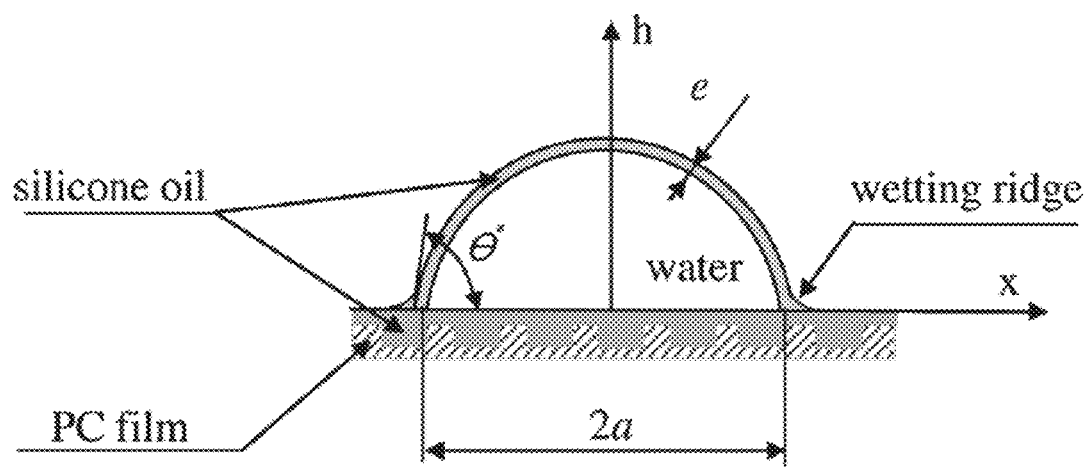
FIG. 5
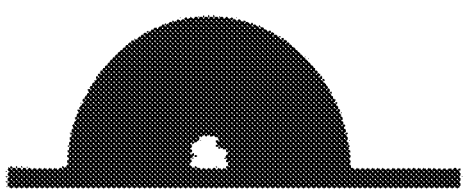
FIG. 6A  FIG. 6B

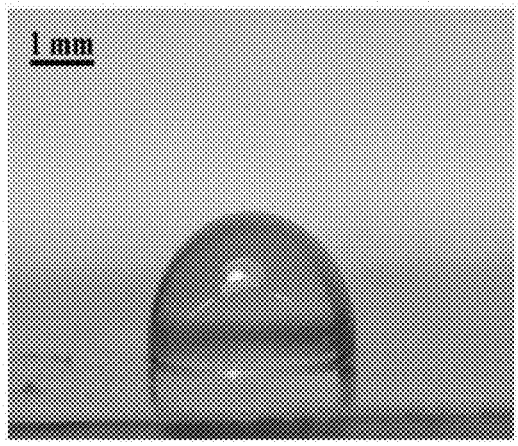
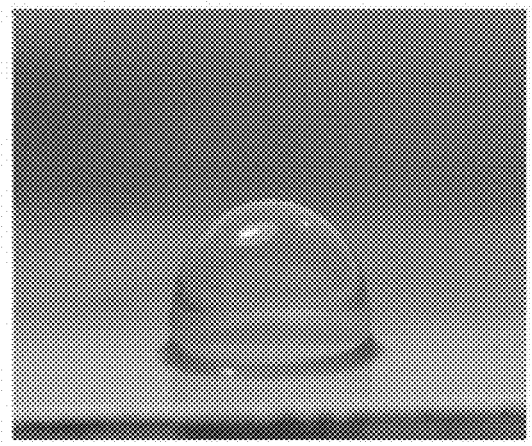
FIG. 7A  FIG. 7B
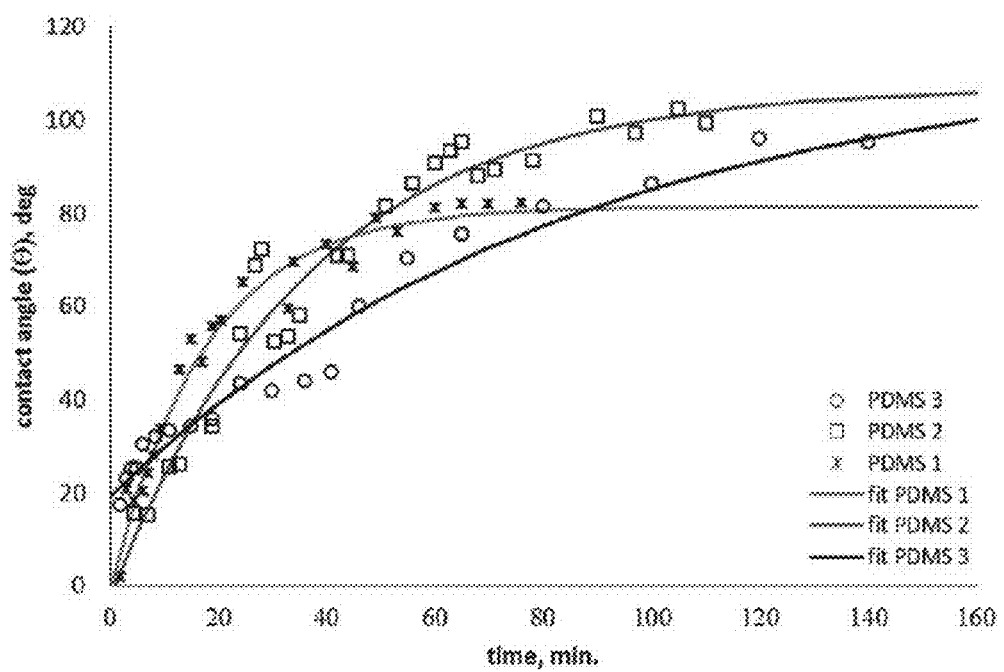
FIG. 8

PLASMA TREATMENT OF LIQUID SURFACES

FIELD AND BACKGROUND OF THE INVENTION

The present invention, in some embodiments thereof, relates to modification of the surface properties of a material, and, more particularly, but not exclusively, to methods of decreasing the contact angle of a liquid surface, to liquid surfaces featuring decreased contact angle and to uses thereof.

Control of surface properties is beneficial in a variety of fields such as metallurgy, electronics, medicine and applied science. One such property is surface wettability.

Wettability accounts for a surface's ability to interact with a liquid, typically an aqueous liquid such as water. A surface is said to be wetted if a liquid spreads over the surface evenly without the formation of droplets. When that liquid is water and it spreads over the surface without forming droplets, the surface is said to be hydrophilic. Practically, hydrophobicity and hydrophilicity are invertly-relative terms.

The utility of hydrophilic or wetted surfaces varies widely. Anti-fog coatings exploit high surface energies to flatten water droplets rather than allowing them to form light-scattering droplets. In biological systems, hydrophilic surfaces can reduce nonspecific bonding of proteins. Hydrophilic surfaces allow formation of tightly adherent layers of water with high lubricity which may be used, for example, to disperse particles in aqueous coatings and oil-in-water emulsions.

Water/oil systems exhibit low contact hysteresis, and the investigation of wetting regimes of such systems has been extensively explored in recent years [Shillingford et al., *Nanotechnology* 2014, 25:014019; Wong et al., *Nature* 2011, 477:443-447; Grinthal & Aizenberg, *Chem Mater* 2014, 26:608-708; Nosnoysky, *Nature* 2001, 477:412-413; Eifert et al., *Adv Mater Interfaces* 2014, 1:1300138].

In many industrial and scientific applications, the hydrophobic nature of liquid substances such as oils and hydrophobic liquid polymers is undesirable and methods of increasing the wettability of these liquids are extensively sought for.

The degree of hydrophilicity of a surface is commonly measured by contact angle symmetry. The contact angle ($\theta$) is the angle at which the subject liquid (e.g., water) interfaces the surface and is determined by the adhesive and cohesive forces of the liquid. As the tendency of a drop to spread out over a surface increases, the contact angle decreases and vice-versa. Thus, the contact angle provides an inverse measure of hydrophilicity or wettability. As a general rule, a surface exhibiting high wettability will have a small contact angles (e.g., smaller than 90°) while a large contact angles (e.g., larger than 90°) is indicative of a non-wettable surface. Due to the important role surface hydrophilicity plays in industrial and research processes, numerous procedures and methods have been developed to modify the wettability of a surface and achieve the desired properties.

One such procedure is plasma treatment. Plasma is a state of ionized gas, sometimes referred as "fourth-state-of-matter", consisting of reactive particles such as electrons, ions and radicals. Plasma treatment (low-pressure and atmospheric-pressure) is widely used for the modification of surface properties of solid polymer materials. The plasma treatment creates a complex mixture of surface functionalities which influence surface physical and chemical properties and results in a dramatic change in the wetting behavior of the surface.

Plasma treatment usually strengthens the hydrophilicity of treated solid polymer surfaces. However, the surface hydrophilicity created by plasma treatment is often lost over time. This effect of decreasing hydrophilicity is called "hydrophobic recovery", and is usually attributed to a variety of physical and chemical processes, including: (1) rearrangement of chemical groups of the surface exposed to plasma treatment, due to the conformational mobility of polymer chains; (2) oxidation and degradation reactions at the plasma-treated surfaces; (3) diffusion of low molecular weight products from the outer layers into the bulk of the polymer; and (4) plasma-treatment induced diffusion of additives introduced into the polymer from its bulk towards its surface [Pascual et al., *J Mater Sci* 2008, 43:4901-4909].

Plasma treatment of solid polydimethylsiloxane surfaces has been reported to enhance hydrophilicity, and to be followed by gradual hydrophobic recovery [Owen & Smith, *J Adhes Sci Technol* 1994, 8:1063-1075; Morra et al., *J Colloid Interface Sci* 1990, 137:11-24].

U.S. Pat. No. 4,822,632 teaches plasma treatment of surfaces covered with PDMS oils were used for the purpose of reducing friction between moving parts. U.S. Pat. No. 6,461,334 teaches surfaces coated by a hydrophilic coating, which can be achieved, inter alia, by plasma treatment of the coating. The treated coating is a solid coating or a coating which becomes solid upon treatment.

Additional background art includes plasma treatment of solid polymers for surface modification and adhesion improvement [Dirk Hegemann et. al, *Nuclear Instruments and Methods in Physics Research,* 2003, B208, 281-286]; Hydrophilization of liquid surfaces by plasma treatment [E. Bormashenko et al., Colloids and Surfaces A: Physicochem. Eng. Aspects 461 (2014) 225-230]; and Quantification and Physics of Cold Plasma Treatment of Organic Liquid Surfaces [E. Bormashenko et al., eprint arXiv:1503.00425, published March 2015].

SUMMARY OF THE INVENTION

According to an aspect of some embodiments of the invention, there is provided a method of decreasing a water contact angle and/or increasing a surface energy of a liquid, the method comprising exposing the liquid to a plasma treatment, thereby decreasing the water contact angle and/or increasing the surface energy of the liquid.

According to an aspect of some embodiments of the invention, there is provided a liquid obtainable by a method of decreasing a water contact angle and/or increasing a surface energy of a liquid, as described herein, the liquid exhibiting a decreased water contact angle and/or increased surface energy, compared to the water contact angle and/or surface energy, respectively, of the liquid prior to the plasma treatment.

According to an aspect of some embodiments of the invention, there is provided a plasma-treated liquid exhibiting a decreased water contact angle and/or increased surface energy, compared to the water contact angle and/or surface energy, respectively, of a non-treated corresponding liquid.

According to an aspect of some embodiments of the invention, there is provided a method of combining a first liquid and a second liquid, the first liquid being immiscible in the second liquid, the method comprising exposing the first liquid and/or the second liquid to a plasma treatment, and subsequent to exposing the first liquid and/or the second liquid to a plasma treatment, combining the first liquid and the second liquid.

According to an aspect of some embodiments of the invention, there is to provided a method of enhancing an adhesion between a liquid and a surface of another substance, the method comprising exposing the liquid to a plasma treatment, and contacting the liquid with the surface prior to, concomitantly with, and/or subsequent to exposing the liquid to a plasma treatment, thereby enhancing the adhesion.

According to some embodiments of the invention, the plasma treatment comprises exposing the liquid to a low-pressure plasma discharge.

According to some embodiments of the invention, the plasma treatment comprises exposing the liquid to an atmospheric-pressure plasma discharge.

According to some embodiments of the invention, the plasma treatment is a cold plasma treatment.

According to some embodiments of the invention, the plasma treatment is effected upon generating the plasma by application of an electromagnetic field of a frequency ranging from 1 to 200 MHz.

According to some embodiments of the invention, the plasma is air plasma.

According to some embodiments of the invention, the plasma treatment comprises RF inductive air plasma discharge.

According to some embodiments of the invention, the plasma is generated by application of an electromagnetic field of a frequency of from 10 to 20 MHz, at a power of from 1 W to 50 W.

According to some embodiments of the invention, the plasma treatment is effected at a pressure of from about 10 Pa to about 500 Pa.

According to some embodiments of the invention, the plasma treatment is effected at a temperature of from 10° C. to 100° C.

According to some embodiments of the invention, during the plasma treatment, the liquid is placed in a porous substrate.

According to some embodiments of the invention, the porous substrate comprises a porous film.

According to some embodiments of the invention, an average size (diameter) of the pores in the porous film ranges from 1 micron to 10 microns, and an average depth of the pores ranges from 0.1 micron to 5 microns.

According to some embodiments of the invention, the atmospheric-pressure plasma comprises plasma jet.

According to some embodiments of the invention, the atmospheric-pressure plasma treatment is performed in a plasma chamber, whereas the liquid is introduced to the chamber as liquid droplets, whereas the liquid droplets are exposed to the plasma treatment.

According to some embodiments of the invention, exposing the liquid to the plasma treatment is effected from a time period that ranges from about 1 second to about 600 seconds.

According to some embodiments of the invention, the liquid is characterized by a viscosity of no more than 1,000 cP.

According to some embodiments of the invention, the liquid is characterized by a spreading parameter higher than 0.

According to some embodiments of the invention, the liquid is characterized by a Tm lower than 30° C.

According to some embodiments of the invention, the liquid comprises a polymeric material.

According to some embodiments of the invention, the liquid comprises a synthetic polymer, a naturally-occurring polymer or a mixture thereof.

According to some embodiments of the invention, the polymeric material comprises an organosilicon polyether.

According to some embodiments of the invention, the silicon polyether is polydimethylsiloxane (PDMS).

According to some embodiments of the invention, the PDMS has a molecular weight that ranges from about 100 grams/mol to about 200,000 grams/mol.

According to some embodiments of the invention, the liquid comprises an oil.

According to some embodiments of the invention, the oil is selected from a mineral oil, a vegetable oil, a fragrant oil and a mixture thereof.

According to some embodiments of the invention, the oil is selected from silicone oil and castor oil.

According to some embodiments of the invention, the water contact angle of the liquid is decreased by at least 20°.

According to some embodiments of the invention, the surface energy of the liquid is increased by at least 5 mJ/m$^2$.

According to some embodiments of the invention, a hydrophobic recovery time following decreasing the water contact angle is at least 15 minutes.

According to some embodiments of the invention, a contact angle between the first and second liquids described herein is higher than 90° prior to exposing the first liquid and/or the second liquid to a plasma treatment.

According to some embodiments of the invention, a contact angle between the first liquid and the second liquid is decreased by at least 20° upon the plasma treatment.

According to some embodiments of the invention, the enhanced adhesion is characterized by a work of adhesion which is at least 5 mJ/m$^2$ greater than a work of adhesion between the liquid and the surface in the absence of the plasma treatment.

According to some embodiments of the invention, the enhanced adhesion is characterized by a reduction in contact angle between the liquid and the surface of the substance of at least 20°.

According to an aspect of some embodiments of the invention, there is provided a method of predicting an apparent contact angle of a liquid droplet on a surface of a substance, the method comprising:

receiving by an electronic device a first surface tension characterizing an interface between the substance and a gas contacting the surface, and a second surface tension characterizing an interface between the substance and the liquid;

calculating by the electronic device a ratio between a first function having a first linear combination of the surface tensions and a second function having a second linear combination of the surface tensions; and calculating by the electronic device the apparent contact angle of the liquid droplet on the surface based at least in part on the calculated ratio.

According to some embodiments of the invention, the liquid is an aqueous liquid and the substance is an oily substance.

According to some embodiments of the invention, a coefficient of the first surface tension in the first linear combination and a coefficient of the second surface to tension in the first linear combination are at opposite signs.

According to some embodiments of the invention, a coefficient of the first surface tension in the second linear combination and a coefficient of the second surface tension in the second linear combination are at equal signs.

According to some embodiments of the invention, the second linear combination comprises an additional term corresponding to a disjoining pressure characterizing a contact between the liquid and the substance.

According to some embodiments of the invention, the apparent contact angle is an arc cosine of the ratio.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

The patent or application file contains at least one drawing executed in color. Copies of this patent or patent application publication with color drawing(s) will be provided by the Office upon request and payment of the necessary fee.

Some embodiments of the invention are herein described, by way of example only, with reference to the accompanying images and drawings. With specific reference now to the images and drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 1 is a scheme depicting an exemplary set up for performing low-pressure plasma treatment according to some embodiments of the invention.

FIG. 2 is a scheme depicting an exemplary set up for performing atmospheric-pressure plasma treatment according to some embodiments of the invention.

FIG. 3 is a scheme depicting an exemplary set up for performing atmospheric-pressure plasma treatment according to some embodiments of the invention.

Figure 4A:
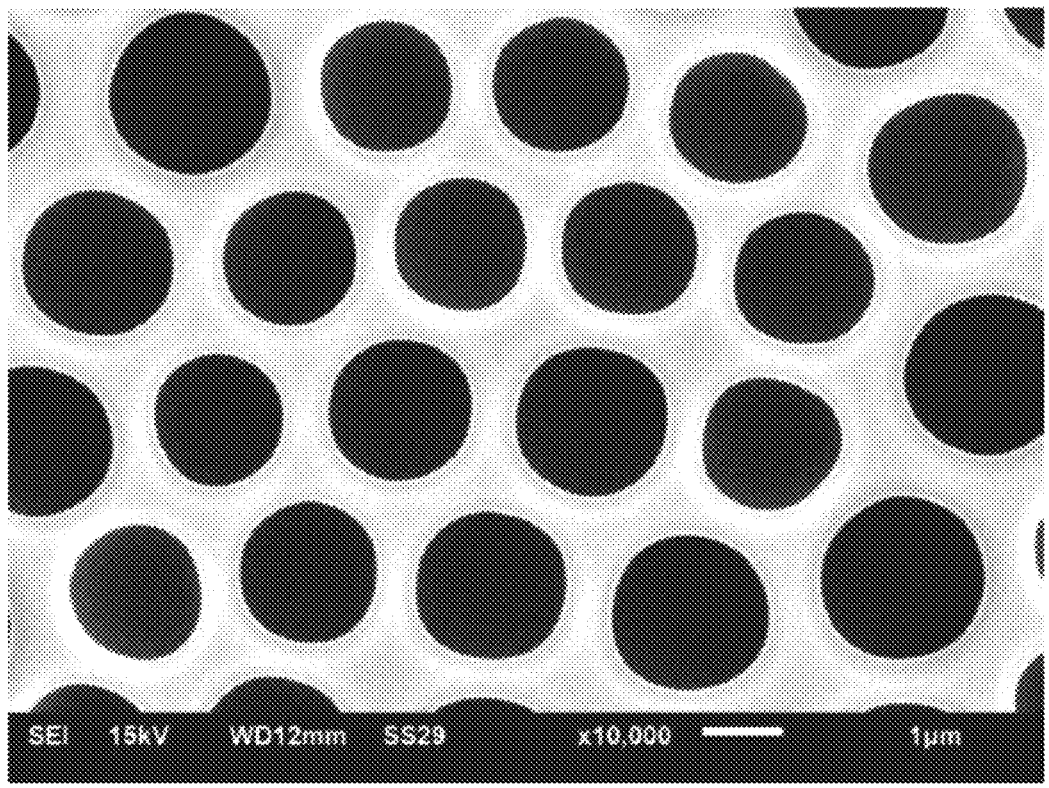

FIG. 4A presents a photograph obtained by scanning electron microscopy (scale bar=1 micron) of a polycarbonate honeycomb coating of aluminum foil obtained with pores termed "breath-figures", used to perform a plasma treatment of PDMS according to some embodiments of the present invention.

Figure 4B:
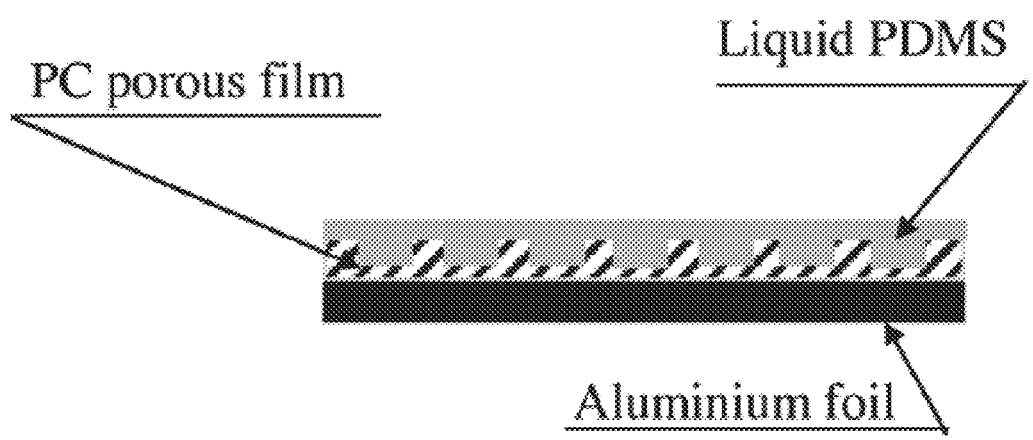

FIG. 4B presents a schematic illustration of the PDMS oil layer sample, deposited in the coated aluminum foil shown in FIG. 4A, onto-which air plasma is discharged, according to some embodiments of the present invention.

FIG. 5 presents a schematic illustration of the wetting regime of a water droplet deposited on a treated silicone oil layer, wherein $\theta^*$ is the apparent contact angle, X to represents the horizontal axis of the surface, h represents the vertical coordinate above of the surface, e represents the thickness of a silicone oil layer engulfing the water droplet and $2a$ stands for the contact diameter.

FIGS. 6A-6B present images taken by a Ramé-Hart goniometer (model 500) of an 8 μl water droplet deposited on non-treated (FIG. 6A) and plasma-treated (FIG. 6B) PDMS1 silicone oil.

FIGS. 7A-7B present photographs of an 8 μl water droplet coated with a layer of non-colored silicone oil (FIG. 7A) and silicone oil colored with an orange pigment (FIG. 7B) (the silicone oil was not plasma-treated).

FIG. 8 presents comparative plots showing of the apparent contact angle (APCA) $\theta^*$ as a function of the time, t, with the solid lines depicting the exponential fitting of experimental data with theoretical Equation 2 detailed hereinunder.

DESCRIPTION OF SPECIFIC EMBODIMENTS OF THE INVENTION

The present invention, in some embodiments thereof, relates to modification of the surface properties of a material, and, more particularly, but not exclusively, to methods of decreasing the contact angle of a liquid surface, to liquid surfaces featuring.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

As discussed hereinabove, manipulating the surface properties of liquids is beneficial in a variety of fields. For example, reducing the water contact angle of liquids and/or increasing the surface energy of liquids has become of interest in fields where water/oil interactions are utilized. While various plasma treatments have been utilized for manipulating surface properties of solids, plasma treatment has not been known heretofore to reduce water contact angle or increase surface energy of liquid substances such as oil.

The present inventors have surprisingly uncovered that exposing liquid oil to plasma treatment provides oil that exhibits a decreased water contact angle and an increased surface energy.

According to an aspect of some embodiments of the present invention, there is provided a method of decreasing a water contact angle and/or increasing a surface energy of a liquid, the method comprising exposing the liquid to a plasma treatment.

Herein, a "water contact angle" of a substance refers to a contact angle (as defined herein) at an interface between the substance and water.

The Plasma Treatment:

Herein and in the art, the term "plasma" describes a gas that has been at least partially ionized. Plasma is considered to consist of a mixture of neutral atoms, atomic ions, electrons, molecular ions, and molecules present in excited and ground states and carrying a high amount of internal energy. Plasma is typically generated by subjecting a gas or a gas mixture to elevated heat or to strong electromagnetic field. Most plasma systems use AC electrical power source and operate at low audio-, radio- or microwave frequency.

When plasma interacts with a surface, "plasma treatment" is initiated. Electrons generated in a plasma discharge impact the treated surface with energies sufficient to break the molecular bonds on the surface of most substrates. Breaking of the molecular bonds creates reactive free radicals on the surface which, in the presence of oxygen, can react rapidly to form various chemical functional groups on the substrate surface, or otherwise affect the surface physical properties. Functional groups resulting from such oxidation reactions include, for example, carbonyl, carboxylate, hydroperoxide and hydroxyl, which are known to be effective in increasing surface energy and enhancing chemical interactions with other surfaces.

The effect of a plasma treatment is typically controlled by selecting plasma parameters such as the gas mixture from which the plasma is generated, the electric power and energy frequency used to generate the plasma, the plasma's temperature, and the pressure at which the plasma is generated. Additional classifying parameters include, for example, exposure time and electron densities.

A number of gases can be used for generating a plasma, including, but not limited to, air, argon, hydrogen, helium, nitrogen, oxygen, steam, CO, and $CO_2$, and to mixtures thereof.

In some embodiments, the gas used to generate plasma comprises nitrogen and/or oxygen. Air is an exemplary gas for generating plasma.

Plasma is often classified by its temperature, that is, as thermal, or hot, plasma or as non-thermal, or cold, plasma.

In thermal plasma typically the gas in nearly fully ionized, whereby in cold plasma the gas is only partially ionized, namely, less than 0%, or less than 5% or about 1% and even less of the gas is ionized.

Plasma is also often classified by the pressure at which it is generated (discharged), and can be a low-pressure plasma discharge, an atmospheric-pressure plasma discharge or a high-pressure plasma discharge.

Figure 1:
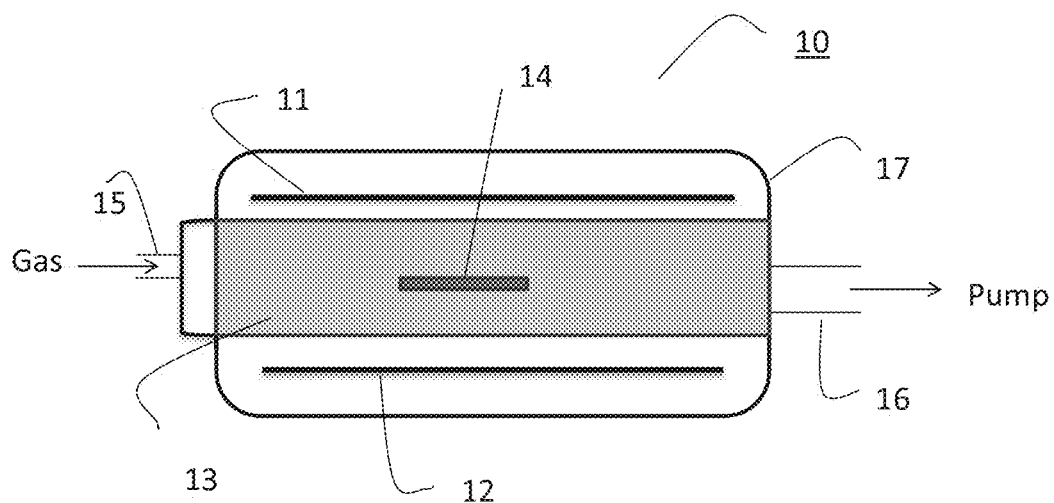

Low pressure, or vacuum, plasma generation and treatment are conducted in a controlled environment inside a sealed chamber, which is maintained at a medium vacuum, usually 2-12 mbar. The gas is typically energized by an electrical high frequency field. When the chamber is filled with activated plasma all surfaces of a treated objects are reached. An exemplary set up for performing a low-pressure plasma treatment is schematically illustrated in FIG. 1. A set up of low-pressure plasma treatment 10 comprises a sealed chamber 17, a pair of electrodes 11 and 12 (a cathode and an anode) electrically connected to an electric power source (not shown), and a sample to be treated 14. Vacuum is typically generated in the chamber by means of a pump 16 and a valve (not shown). The gas or gas mixture enters the chamber through a gas inlet 15 and a valve (not shown), and an electromagnetic field is applied, to thereby generate plasma 13.

Atmospheric-pressure plasma treatment is conducted in a plasma chamber in which the pressure approximately matches that of the surrounding atmosphere, or in an open chamber. Common atmospheric-pressure plasmas include plasma generated by AC excitation (corona discharge) and plasma jets. The plasma jet technology involves the use of a high-voltage discharge (between 5 and 15 kV in the frequency range of 10 to 100 kHz) to create a pulsed electric charge in an enclosed chamber. A gas is then allowed to flow through the discharge section to form the plasma. This plasma then passes through a jet head towards the surface of the material to be treated. An exemplary set up for performing a plasma treatment is schematically illustrated in to FIG. 2. A set up of atmospheric-pressure plasma jet treatment 20 comprises a chamber 28, in which a sample to be treated 25 is placed. Chamber 28 is shown in the figure as a closed chamber but can alternatively be an open chamber. The plasma 23 is typically generated in closed chamber 26 which comprises a pair of electrodes 21 and 22 (a cathode and an anode) electrically connected to an electric power source (not shown). The gas or gas mixture enters the chamber through a gas inlet 24 and a valve (not shown), and an electromagnetic field is applied. The plasma discharge 23 then passes through a jet head 27 into chamber 28.

Sample 25 can be a liquid per se (e.g., as a bulk of the liquid substance), and chamber 28 may be at least partially filled with the liquid. Sample 25 can alternatively be a liquid placed in a porous substrate, as described hereinafter, or any other substrate.

Optionally, Sample 25 is a liquid per se, and the plasma chamber is configured such that the plasma jet submerges with the liquid by means, of e.g., a circulating torch.

According to some of any of the embodiments described herein, the plasma treatment is effected with air plasma, that is, the gas mixture from which plasma is generated is air. Other gases and gas mixtures such as, but not limited to, those described herein are also contemplated.

According to some of any of the embodiments of the present invention, the plasma treatment is a cold plasma treatment, as this term is to be understood by those skilled in the art.

In some of any of the embodiments described herein, exposing the liquid to a plasma treatment as described herein is effected during a time period that ranges from about 1 second to about 600 seconds, or from about 1 second to about 200 seconds, or from about 1 second to about 100 seconds, or from about 1 second to about 50 seconds, including any subranges and intermediate values therebetween. Shorter (e.g., less then 1 second, for example, a few milliseconds) and longer tome periods are also contemplated, depending on the liquid substance to be treated, the type of plasma treatment and the desired properties thereof upon treatment.

According to some of any of the embodiments of the present invention, the to plasma treatment is effected upon generating the plasma by application of an electromagnetic field, as described herein. In some embodiments, the electromagnetic field is applied at a radiofrequency energy. In some embodiments, the plasma is generated at frequency in a range of from 1 to 200 MHz, or 1 to 100 MHz, or 1 to 50

MHz, or 10 to 50 MHz, or optionally from 10 to 20 MHz, including any subranges and intermediate values therebetween.

According to some of any of the embodiments of the present invention, the plasma treatment is effected upon generating the plasma by application of a high voltage (alternating or non-alternating current), for example, by glow discharge, electric arcing and/or corona discharge. The application of high voltage may be continuous or comprise repeated brief discharges (for example, at a rate of at least 1 kHz, optionally at least 10 kHz, and optionally in a range of from 10 to 100 kHz). The high voltage is optionally at least 1 kV, optionally from 1 to 50 kV, optionally at least 5 kV, and optionally in a range of from 5 to 15 kV, including any subranges and intermediate values therebetween.

According to some of any of the embodiments described herein, the plasma treatment is a low-pressure plasma treatment, and, in some embodiments, the plasma treatment comprises exposing the liquid to a low-pressure plasma discharge.

In some of these embodiments, the plasma is generated in a sealed vacuum chamber and the liquid is exposed to the plasma treatment, optionally in the same sealed chamber. In some embodiments, the pressure in such a chamber is lower than 1000 Pa.

In exemplary embodiments of a low-pressure plasma treatment, the plasma treatment comprises RF inductive air plasma discharge, namely, the gas mixture is air, and the plasma is generated by application of RF energy.

In some of these exemplary embodiments, the plasma is generated by application of an electromagnetic field, as described herein. In some embodiments, an electromagnetic field is applied at a (radio) frequency of from 10 to 20 MHz, and a power in the range of from 1 W to 50 W.

In some of these exemplary embodiments, the plasma treatment is a low-pressure plasma treatment effected at a pressure of from about 10 Pa to about 500 Pa.

In some of these exemplary embodiments, the plasma treatment is effected at a temperature of from 10° C. to 100° C., for example, at ambient temperature.

In some of these exemplary embodiments, the sample is exposed to the plasma treatment for 1-60 seconds (e.g., for 30 second).

Figure 2:
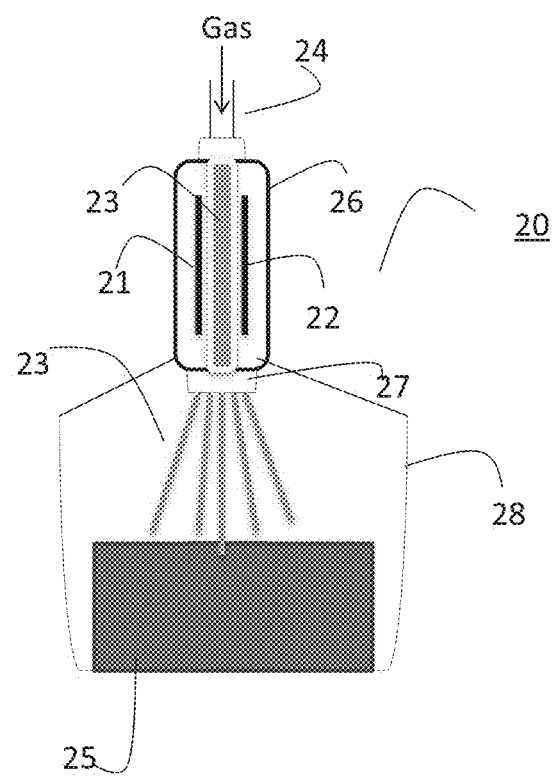

In other exemplary embodiments, the plasma treatment comprises an atmospheric-pressure plasma discharge, as described herein, for example, by means of a plasma jet, as described herein (for example, as depicted in FIG. 2 and accompanying description hereinabove).

In some of any of the embodiments described herein, the liquid is exposed to the plasma treatment while being placed in a porous substrate. This enables to more accurately measure the apparent water contact angle of the treated liquid, as explained in further detail hereinunder.

In some of these embodiments, the porous substrate comprises a porous film, for example, a plastic porous film.

Preferably, the substrate or film is microporous, such that an average size of at least one dimension of the pores ranges from 0.1 to 100 microns.

In some embodiments, an average diameter of the pores ranges from 0.1 micron to 100 microns, or from 1 micron to 10 microns, including any subranges and intermediate values therebetween. Alternatively or in addition, an average depth of the pores ranges from 0.1 micron to 10 microns, or from 1 micron to 5 microns, including any subranges and intermediate values therebetween.

An exemplary porous substrate is depicted in FIGS. 4A and 4B.

Sample 15 in FIG. 1 and sample 25 in FIG. 2 can be a liquid placed in a porous substrate, as described in any of the respective embodiments herein.

In some of any of the embodiments described herein, the plasma treatment comprises exposing the liquid to atmospheric-pressure plasma, and the liquid is exposed to the plasma treatment as liquid droplets.

In some of these embodiments, the plasma treatment is effected in a plasma chamber and the liquid droplets are introduced to the chamber by means of, for example, an aerosol or spray dispenser such as, for example, a spray nozzle, a nebulizer, an atomizer.

Figure 3:
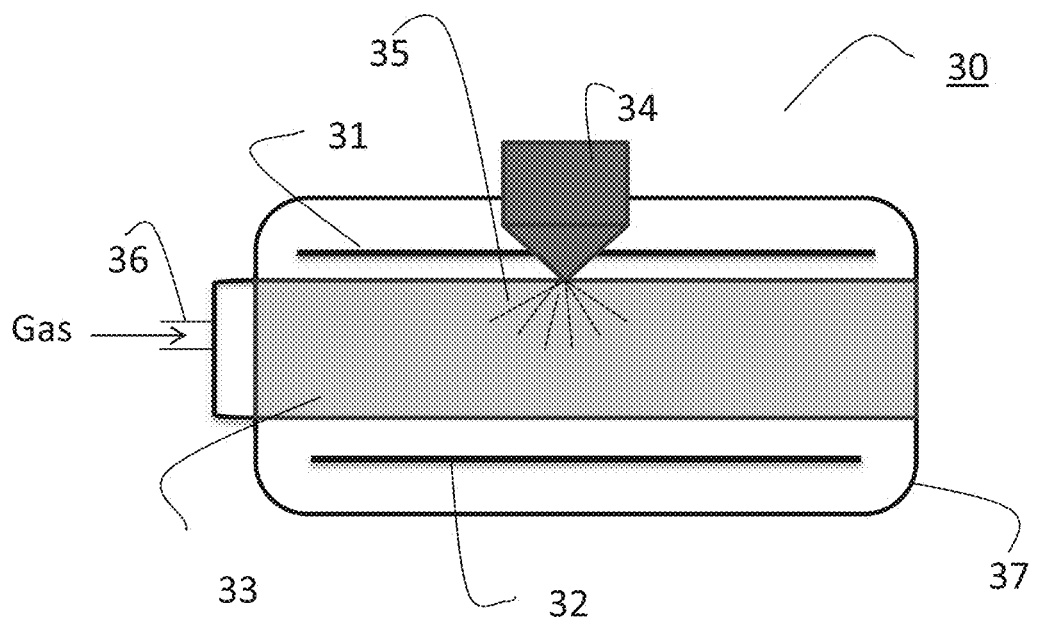

An exemplary set up for introducing the liquid as liquid droplets to a plasma chamber is schematically illustrated in FIG. 3. A set up for exposing a liquid to atmospheric-pressure plasma treatment 30 is comprised of plasma chamber 37 in which are placed electrodes 31 and 32, electrically connected to a power source (not shown). A gas or gas mixture are introduced to the chamber via a gas inlet 36, and optionally a valve (not shown). The liquid droplets 35 are dispensed directly into chamber 37 by means of an aerosol dispenser (not shown) from liquid reservoir 34. Plasma 33 is generated in the chamber upon application of power, and the liquid droplets are exposed to plasma 33.

Alternatively, plasma 33 is generated in chamber 37 and then flows out of the chamber, optionally to another chamber, and liquid droplets 35 are contacted with plasma 33 upon its exit from the chamber (not shown).

Plasma treatment of a liquid in a form of droplets is preferred for enhancing miscibility (according to any of the respective embodiments described herein) or for any other application where treating a large surface area of the liquid is desired.

The Liquid:

Herein throughout, the term "liquid" describes a fluid substance in a liquid state.

Herein throughout, exposing a liquid to a plasma treatment means that a substance is a liquid state is exposed to the plasma treatment as described herein.

In some embodiments, the substance is liquid at ambient temperature.

Alternatively, the substance is solid at ambient temperature (e.g., 25° C.) and is heated above its melting point (Tm), such that it is a liquid when it is exposed to the plasma treatment.

In some of any of the embodiments described herein, the liquid is characterized by a Tm lower than 300° C. In some embodiments, the Tm is lower than 200° C. In some embodiments, the Tm is lower than 100° C.

In some of any of the embodiments described herein, the liquid is in a single-phase, that is, it is not an emulsion or any other multi-phase liquid form.

In some of any of the embodiments described herein, the liquid is characterized by a viscosity of no more than 1,000 cP. By "viscosity" of a liquid it is meant a viscosity at the temperature at which the substance is exposed to the plasma treatment. In some embodiments, a viscosity as described herein refers to a liquid at ambient temperature.

In some of any of the embodiments described herein, the liquid is characterized (upon contact with water and air) by a spreading parameter higher than 0.

As exemplified herein, a liquid which such a spreading parameter may engulf a water droplet by spreading over the whole surface of the water droplet.

The phrase "spreading parameter" describes the ability of a liquid to spread and is typically defined as the energy difference per unit area of a substrate when dry versus when wet.

A spreading parameter as defined herein typically refers to a liquid at ambient temperature, however, when a substance is a liquid at a higher temperature, a spreading parameter as defined herein refers to a spreading parameter at the temperature at which the substance is exposed to the plasma treatment. In some embodiments, a spreading parameter as described herein refers to a liquid at ambient temperature.

In some of any of the embodiments described herein, the liquid is an organic substance, which features any of the properties described herein.

In some of any of the embodiments described herein, the liquid is an organic substance featuring a water contact angle of at least 50°, at least 60°, at least 80°, at least 90°, and optionally and preferably, a water contact angle higher than 90°, e.g., 100°, 110°, 120° and higher.

In some of any of the embodiments described herein, the liquid comprises, or is, a polymeric material.

In some embodiments, at least 10 weight percents of the liquid is a polymeric material. In some embodiments, at least 20 weight percents of the liquid is a polymeric material. In some embodiments, at least 30 weight percents of the liquid is a polymeric material. In some embodiments, at least 40 weight percents of the liquid is a polymeric material. In some embodiments, at least 50 weight percents of the liquid is a polymeric material. In some embodiments, at least 60 weight percents of the liquid is a polymeric material. In some embodiments, at least 70 weight percents of the liquid is a polymeric material. In some embodiments, at least 80 weight percents of the liquid is a polymeric material. In some embodiments, at least 90 weight percents of the liquid is a polymeric material.

By "polymeric material" it is meant herein a material composed of molecules having at least 10 repeat units (optionally at least 50 units), and encompasses homopolymers (having one species of monomeric unit), copolymers (having two or more different species of monomeric unit), and mixtures of polymers and/or copolymers.

In some embodiments, an average molecular weight of the polymer (weight-average molecular weight) is at least 0.5 kDa. In some embodiments, the average molecular weight is at least 1 kDa. In some embodiments, the average molecular weight is at least 2 kDa. In some embodiments, the average molecular weight is at least 5 kDa. In some embodiments, the average molecular weight is at least 10 kDa. In some embodiments, the average molecular weight is at least 20 kDa. In some embodiments, the average molecular weight is at least 50 kDa.

In some embodiments, an average molecular weight of the polymer (weight-average molecular weight) is no more than 100 kDa.

In some embodiments, the liquid comprises a synthetic polymer, a naturally-occurring polymer or a mixture thereof.

Examples of polymeric material which may included in a liquid described herein (and/or may be a liquid described herein) include, without limitation, a polyolefins (e.g., polyethylene, polypropylene and copolymers thereof); poly(alkylene glycols) (e.g., poly(ethylene glycol) (PEG), poly(propylene glycol) (PPG), poly(tetrahydrofuran) (PTHF), and copolymers thereof); polyesters, for example copolymers of an alkylene glycol (e.g., ethylene glycol and/or propylene glycol) and a diacid (e.g., phthalic acid, maleic acid); non-cured rubbers (e.g., polyisoprene, polybutadiene, polychloroprene, butyl rubber, and copolymers thereof); liquid elastomers; polysulfides (e.g., liquid polysulfides); liquid crystalline polymers; and copolymers thereof.

In some of any of the embodiments described herein, the polymeric material to comprises, or is, an organosilicon polymer, and in some embodiments, the polymeric material comprises a backbone of polydialkylsiloxone.

Exemplary such organosilicon polymers can be represented by Formula I:

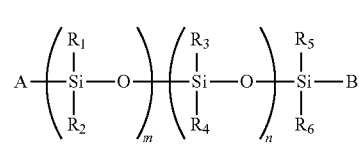

Formula I wherein:

n and m each independently an integer, wherein n+m is an integer of from 1 to 500, representing the number of backbone units in the polymeric backbone, minus 1; and $R_1$-$R_6$, A and B are each independently selected from a substituted or unsubstituted alkyl or an alkylene chain terminated with a functional group.

Examples of a functional group which may optionally terminate the alkylene include, without limitation, alkenyl, alkynyl, cycloalkyl, aryl, heteroaryl, heteroalicyclic, halo, hydroxy, alkoxy, aryloxy, thiohydroxy, thioalkoxy, thioaryloxy, sulfinyl, sulfonyl, cyano, nitro, azide, phosphonyl, phosphinyl, carbonyl, thiocarbonyl, urea, thiourea, O-carbamyl, N-carbamyl, O-thiocarbamyl, N-thiocarbamyl, C-amido, N-amido, C-carboxy, O-carboxy, sulfonamido, and amino (as these groups are defined herein).

In some embodiments, each of $R_1$-$R_6$, A and B is methyl, and the organosilicon polymer is polydimethylsiloxane (PDMS).

In some embodiments, the PDMS has a molecular weight (weight average molecular weight) that ranges from about 100 grams/mol to about 200,000 grams/mol. In some embodiments, the PDMS has a molecular weight that ranges from about 500 grams/mol to about 100,000 grams/mol. In some embodiments, the PDMS has a molecular weight that ranges from about 1,000 grams/mol to about 100,000 grams/mol. In some embodiments, the PDMS has a molecular weight that ranges from about 3,000 grams/mol to about 50,000 grams/mol.

In some embodiments, the PDMS has a molecular weight (weight average molecular weight) that ranges from about 500 grams/mol to about 200,000 grams/mol. In some embodiments, the PDMS has a molecular weight that ranges from about 1,000 grams/mol to about 200,000 grams/mol. In some embodiments, the PDMS has a molecular weight that ranges from about 3000 grams/mol to about 200,000 grams/mol. In some embodiments, the PDMS has a molecular weight that ranges from about 10,000 grams/mol to about 200,000 grams/mol. In some embodiments, the PDMS has a molecular weight that ranges from about 30,000 grams/mol to about 200,000 grams/mol. In some embodiments, the PDMS has a molecular weight that ranges from about 100,000 grams/mol to about 200,000 grams/mol.

In some embodiments, the PDMS has a molecular weight (weight average molecular weight) that ranges from about 100 grams/mol to about 100,000 grams/mol. In some embodiments, the PDMS has a molecular weight that ranges from about 100 grams/mol to about 30,000 grams/mol. In some embodiments, the PDMS has a molecular weight that ranges from about 100 grams/mol to about 10,000 grams/ mol. In some embodiments, the PDMS has a molecular weight that ranges from about 100 grams/mol to about 3,000 grams/mol.

In some of any of the embodiments described herein, the liquid is, or comprises, an oil.

By "oil" it is meant herein a hydrophobic organic substance that is liquid at ambient temperature.

The oil can be a mineral oil, a vegetable oil, a fragrant oil and any mixture thereof.

The term "mineral oil", as used herein, generally describes a liquid obtained from the distillation of petroleum. It may also be referred to as white oil, white mineral oil, liquid petrolatum, liquid paraffin or white paraffin oil.

The term "mineral oil" also encompasses a mineral oil replacement. Mineral oil replacements include alkanes having at least 10 carbon atoms (e.g., isohexadecane), benzoate esters, aliphatic esters, noncomodogenic esters, volatile silicone compounds (e.g., cyclomethicone), and volatile silicone substitutes. to Examples of benzoate esters include $C_{12}C_{15}$ alkyl benzoate, isostearyl benzoate, 2-ethyl hexyl benzoate, dipropylene glycol benzoate, octyldodecyl benzoate, stearyl benzoate, and behenyl benzoate. Examples of aliphatic esters include $C_{12}C_{15}$ alkyl octonoate and dioctyl maleate. Examples of noncomodogenic esters include isononyl isononanoate, isodecyl isononanoate, diisostearyl dimer dilinoleate, arachidyl propionate, and isotridecyl isononanoate. Examples of volatile silicone substitutes include isohexyl decanoate, octyl isononanoate, isononyl octanoate, and diethylene glycol dioctanoate.

Non-limiting examples of vegetable oils suitable for use in the context of the present embodiments include olive oil, almond oil, canola oil, coconut oil, corn oil, cottonseed oil, peanut oil, saffron oil, sesame oil, soybean oil, turmeric oil, oregano oil, black cumin seed oil, tea tree oil, eucalyptus oil, rosemary oil and any combination thereof.

A "fragrant oil" describes an oil which produces an olfactory effect. Fragrant oils include perfume oils and natural aroma mixtures, such as those accessible from plant sources, for example citrus oil, jasmine oil, mint oil, patchouli oil, peppermint oil, pine oil, rose oil, spearmint oil, spruce oil and ylang-ylang oil. Also suitable are muscatel oil, salvia oil, chamomile oil, clove oil, lemon balm oil, cinnamon leaf oil, linden blossom oil, juniper berry oil, vetiver oil, olibanum oil, galbanum oil, and labdanum oil, orange blossom oil, neroli oil, orange peel oil, and sandalwood oil. Other suitable fragrant oils include, but are not limited to, oils derived from fruits such as almond, apple, cherry, grape, pear, pineapple, orange, strawberry, raspberry; and oils derived from flowers such as lavender, iris, and carnation. Other fragrant oils include musk, rosemary, thyme and sage. Lists of suitable fragrant oils are provided, for example, in U.S. Pat. Nos. 4,534,891, 5,112,688 and 5,145,842, which are incorporated by reference as if fully set forth herein.

In some of any of the embodiments described herein, during the plasma treatment, the liquid is not in a form of a thin film deposited on a (solid or liquid) substrate.

Herein, the term "thin film" refers to a thickness less than 0.1 mm, or less than 10 microns, or less than 1 micron, or less than 0.1 micron.

During plasma treatment, the liquid may optionally be, for example, in bulk to form, and/or in the form of small droplets suspended in a gas (i.e., not deposited on a substrate).

In some embodiments, a depth (e.g., distance between surface and underlying substrate) of a bulk form of the liquid during plasma treatment is at least 0.1 micron.

In some embodiments, the depth is at least 1 micron. In some embodiments, the depth is at least 10 microns. In some embodiments, the depth is at least 0.1 mm. In some embodiments, the depth is at least 1 mm.

Without being bound by any particular theory, it is believed that avoidance of a deposited thin film during plasma treatment may reduce cross-linking of the liquid to the underlying substrate.

Applications:

By utilizing a method as described herein in any of the respective embodiments and any combination therein, a liquid exhibiting a decreased water contact angle and/or increased surface energy, compared to the water contact angle and/or surface energy, respectively, of the liquid prior to the plasma treatment, is obtainable.

Thus, according to an aspect of some embodiments of the present invention, there is provided a liquid obtainable by a method as described herein.

According to an aspect of some embodiments of the present invention there is provided a plasma-treated liquid exhibiting a decreased water contact angle and/or increased surface energy, compared to the water contact angle and/or surface energy, respectively, of a non-treated corresponding liquid.

According to some of any of the embodiments described herein, a plasma-treated liquid as described herein is characterized by water contact angle that is decreased by at least 10%, compared to a water contact angle of the same liquid when not exposed to the plasma treatment (a non-treated liquid). In some embodiments, the water contact angle is decreased by at least 20%. In some embodiments, the water contact angle is decreased by at least 30%. In some embodiments, the water contact angle is decreased by at least 40%. In some embodiments, the water contact angle is decreased by at least 50%. In some embodiments, the water contact angle is decreased by at least 60%. In some embodiments, the water contact angle is decreased by at least 70%. In some embodiments, the water contact angle is decreased by at least 80%. In some embodiments, the water contact angle is decreased by at least 90%. In some embodiments, the water contact angle is decreased by at least 95%. In some embodiments, the water contact angle is decreased by at least 98%.

According to some of any of the embodiments described herein, a plasma-treated liquid as described herein is characterized by water contact angle that is decreased by at least 20°, compared to a non-treated liquid. In some embodiments, the water contact angle is decreased by at least 30°. In some embodiments, the water contact angle is decreased by at least 40°. In some embodiments, the water contact angle is decreased by at least 50°. In some embodiments, the water contact angle is decreased by at least 60°. In some embodiments, the water contact angle is decreased by at least 70°. In some embodiments, the water contact angle is decreased by at least 80°. In some embodiments, where applicable (e.g., the water contact angle of a non-treated liquid substance is higher than 90°) the water contact angle is decreased by at least 90°.

According to some of any of the embodiments described herein, a plasma-treated liquid as described herein is characterized by a surface energy (in units of energy per area) that is increased by at least 10%, compared to a non-treated liquid.

In some embodiments, the surface energy of the liquid is increased by at least 20%. In some embodiments, the surface energy of the liquid is increased by at least 30%. In some embodiments, the surface energy of the liquid is increased by at least 40%. In some embodiments, the surface energy of the liquid is increased by at least 50%. In some embodiments, the surface energy of the liquid is increased by at least 60%. In some embodiments, the surface energy of the liquid is increased by at least 70%. In some embodiments, the surface energy of the liquid is increased by at least 80%. In some embodiments, the surface energy of the liquid is increased by at least 100% (i.e., the surface energy is doubled). In some embodiments, the surface energy of the liquid is increased by at least 125%. In some embodiments, the surface energy of the liquid is increased by at least 150%. In some embodiments, the surface energy of the liquid is increased by at least 200% (i.e., the surface energy is tripled).

According to some of any of the embodiments described herein, a plasma-treated liquid as described herein is characterized by a surface energy that is increased by at least 5 mJ/m$^2$, compared to a non-treated liquid. In some embodiments, the surface energy of the liquid is increased by at least 10 mJ/m$^2$. In some embodiments, the surface energy of the liquid is increased by at least 15 mJ/m$^2$. In some embodiments, the surface energy of the liquid is increased by at least 20 mJ/m$^2$. In some embodiments, the surface energy of the liquid is increased by at least 25 mJ/m$^2$.

In some embodiments, the surface energy of the liquid is increased by at least 30 mJ/m$^2$. In some embodiments, the surface energy of the liquid is increased by at least 35 mJ/m$^2$. In some embodiments, the surface energy of the liquid is increased by at least 40 mJ/m$^2$.

Herein, a "surface energy" (also referred to herein interchangeably as "surface tension") of a substance refers to the energy per unit area of an interface between the substance and another material. Unless otherwise specified, the other material is air (at atmospheric pressure)—e.g., a surface energy of a liquid is a surface energy of a liquid/air interface—and the temperature is ambient temperature (e.g., 25° C.).

According to some of any of the embodiments described herein, a plasma-treated liquid as described herein is characterized by a hydrophobic recovery time following the plasma treatment of at least 15 minutes. In some embodiments, the hydrophobic recovery time following the plasma treatment is at least 20 minutes. In some embodiments, the hydrophobic recovery time following the plasma treatment is at least 30 minutes. In some embodiments, the hydrophobic recovery time following the plasma treatment is at least 45 minutes. In some embodiments, the hydrophobic recovery time following the plasma treatment of at least 60 minutes.

Herein, the phrase "hydrophobic recovery time" refers to a parameter characterizing a hydrophobic recovery (rate of increase in water contact angle after treatment), e.g., τ in Equation 2 in the Examples section. The hydrophobic recovery time may be determined by fitting experimental data showing the water contact angle at various times to Equation 2 presented below, as exemplified in the Examples section.

Decreasing a water contact angle and/or increasing a surface energy of a liquid (according to any of the respective embodiments described herein) may optionally be used to enhance the tendency of the liquid to come into contact with (e.g., wet) another substance (e.g., a non-gaseous substance).

For example, decreasing a water contact angle of a liquid (according to any of the respective embodiments described herein) may optionally be used to enhance the tendency of the liquid to come into contact with a polar substance (e.g., water).

According to an aspect of some embodiments of the invention, there is provided a method of combining a first liquid and a second liquid, the first liquid being immiscible in the second liquid, the method comprising exposing the first liquid and/or the second liquid to a plasma treatment and combining the first liquid and the second liquid. In some embodiments, combining the first liquid and the second liquid is effected subsequent to exposing the first liquid and/or the second liquid to a plasma treatment.

Herein, the term "immiscible" refers to a substance being incapable of forming a solution with another substance at any proportions of the two substances, such that the substances when combined (at least in some proportions) form more than one phase.

In some embodiments, the method comprises combining the first liquid and second liquid in proportions which form more than one phase, rather than forming a solution. For example, the amount of the first liquid may be above an amount which dissolves in the second liquid (or vice versa).

In some embodiments, the immiscible first and second liquids are characterized by a contact angle between the first and second liquids (at the interface of the first and second liquids) which is higher than 90° (prior to plasma treatment).

In some embodiments, a mixture obtained by combining the first liquid and second liquid is a dispersion (e.g., an emulsion). In some embodiments, the suspension is a colloidal dispersion.

Herein, a "colloidal dispersion" refers to a dispersion in which a particle diameter of the dispersed phase is in a range of from 1 nanometer to 1 micron.

In some embodiments, a mixture obtained by combining the first liquid and second liquid is a solution.

In some embodiments, the first liquid and/or second liquid is formed by melting a solid, for example, by heating to an above-ambient temperature.

In some embodiments, the first and/or second liquid is a substance which is solid at ambient temperature (e.g., 25° C.) and the method comprises heating the liquid to above its melting point, so as to obtain the liquid.

In some embodiments, after combining the first liquid and second liquid, at least one of the liquids undergoes solidification. In some embodiments, solidification is effected by cooling the combined liquids, for example, by cooling a heated mixture to ambient temperature.

In some embodiments, a mixture obtained upon solidification of the first and/or second liquid is a solid dispersion (e.g., a solid in solid dispersion and/or a liquid in solid dispersion), optionally a solid colloidal dispersion. In some such embodiments, at least the continuous phase of the mixture is subjected to solidification (e.g., by cooling).

In some embodiments, a mixture obtained upon solidification of the first and/or second liquid is a solid solution.

Without being bound by any particular theory, it is believed that the method described herein is particularly useful for preparing stable and relatively homogenous solid mixtures (e.g., solutions and/or fine dispersions) from immiscible substances without requiring additives such as stabilizers and/or emulsifiers.

According to another aspect of embodiments described herein, there is provided a method of enhancing an adhesion between a liquid (e.g., a liquid according to any of the respective embodiments described herein) and a surface of another substance. The method comprises exposing the liquid to a plasma treatment, and contacting the liquid with the surface.

Contacting the liquid with the surface may optionally be effected prior to, concomitantly with, and/or subsequent to exposing the liquid to plasma treatment.

The surface of the other substance may optionally be a liquid (e.g., a second liquid according to any of the respective embodiments described herein) and/or a solid surface.

In some embodiments, the surface is a hydrophilic surface, and the plasma treatment renders the liquid more hydrophilic, thereby enhancing adhesion.

In some embodiments, the method of enhancing adhesion of a liquid to a surface is for facilitating application of the liquid onto the surface.

Examples of liquids whose application onto a surface may be facilitated by enhancing adhesion to a surface include, without limitation, paints, varnishes, liquid colorant compositions (e.g., solutions of dyes and/or pigments), perfumes, and adhesives.

In some embodiments, the method of enhancing adhesion of a liquid to a surface is for facilitating combination of a solid (e.g., in powder form) with the liquid, for example, by promoting wetting of the solid by the liquid and/or reducing air pockets on a solid surface (e.g., air pockets which cause a solid to float in the liquid, and thereby mix less readily with the liquid).

According to some of any of the embodiments described herein, the enhanced adhesion is characterized by a work of adhesion (following plasma treatment) which is at least 5 $mJ/m^2$ greater than a work of adhesion between the liquid and the surface in the absence of the plasma treatment (compared to a non-treated liquid). In some embodiments, the work of adhesion is increased by at least 10 $mJ/m^2$ by the plasma treatment. In some embodiments, the work of adhesion is increased by at least 15 $mJ/m^2$. In some embodiments, the work of adhesion is increased by at least 20 $mJ/m^2$.

In some embodiments, the work of adhesion is increased by at least 25 $mJ/m^2$.

In some embodiments, the work of adhesion is increased by at least 30 $mJ/m^2$.

In some embodiments, the work of adhesion is increased by at least 35 $mJ/m^2$.

In some embodiments, the work of adhesion is increased by at least 40 $mJ/m^2$.

Herein, a "work of adhesion" of a substance refers to the energy per unit area of an interface of two material required to separate the two material.

For a liquid on a solid surface, a work of adhesion may optionally be determined by subtracting the surface energy of the liquid/solid interface from the sum of the surface energy of the liquid and the surface energy of the solid surface (e.g., under air at atmospheric pressure and ambient temperature (e.g., 25° C.).

According to some of any of the embodiments described herein relating to combining a first liquid and second liquid and/or enhancing an adhesion between a liquid and a surface of another substance, a contact angle between the liquid (e.g., first liquid described herein) and the second liquid and/or surface of another substance described herein is decreased upon plasma treatment (as described herein) by at least to 20°, compared to contact angle between the same substances without the plasma treatment. In some embodiments, the contact angle is decreased by at least 30°. In some embodiments, the contact angle is decreased by at least 40°. In some embodiments, the contact angle is decreased by at least 50°. In some embodiments, the contact angle is decreased by at least 60°. In some embodiments, the contact angle is decreased by at least 70°. In some embodiments, the contact angle is decreased by at least 80°. In some embodiments, the contact angle is decreased by at least 90°.

Contact Angle Determination:

Herein, the term "contact angle" encompasses apparent contact angles, which are determined by measurement, and contact angles calculated based on other parameters (e.g., via Young's equation or Equations 9 or 10 below).

In preferred embodiments, the contact angle is an equilibrium contact angle.

Similarly, the term "water contact angle" encompasses apparent contact angles with water which are determined by measurement (also referred to herein as an "apparent water contact angle"), and water contact angles calculated based on other parameters (e.g., via Young's equation or Equations 9 or 10 below).

In some embodiments, the contact angle is an apparent contact angle, determined by measurement.

As exemplified and discussed in detail herein below, an apparent contact angle between two liquids may differ from that of a contact angle calculated using a model of a solid surface (e.g., using Young's equation), for example, due to coating of a droplet of one liquid by another.

Furthermore, as is known in the art, an apparent contact angle on a rough surface may differ from that of a theoretically calculated contact angle.

When a liquid droplet is placed on a solid surface, determination of the contact angle is relatively straightforward, using standard techniques used in the art.

In order to determine a contact angle at an interface between two liquids (for example, between a liquid described herein and water), a droplet of one of the liquids may be placed on a surface (e.g., flat surface) of the other liquid (also referred herein to as the "underlying liquid"), to form the interface.

As exemplified herein, determination of the contact angle between liquids is to generally easier when the underlying liquid surface is of a thin liquid layer (e.g., less than 100 μm thick, optionally about 20 μm thick), as a sharper angle may be formed at the point of contact.

As further exemplified herein, such thin layers may optionally be prepared by applying the underlying liquid onto a substrate (e.g., a porous substrate described herein) which is readily wetted by the underlying liquid.

For example, a water contact angle of a water-immiscible liquid may optionally be determined by placing a water droplet on a layer (e.g., a thin layer described herein) of the liquid (e.g., a liquid denser than water, such as silicone oil), to thereby determine a water contact angle of the water-immiscible liquid. The layer of the liquid may optionally be disposed on a hydrophobic and/or oleophilic substrate.

Alternatively or additionally, a water contact angle of a water-immiscible liquid may optionally be determined by placing a droplet of the liquid (e.g., a liquid less dense than water, such as a lipid and/or olefin) on a layer (e.g., a thin layer described herein) of water, to thereby determine a water contact angle of the water-immiscible liquid. The layer of the water may optionally be disposed on a hydrophilic and/or oleophobic substrate.

The ability of liquid to spread is oftentimes characterized by a quantity known as a spreading parameter, denoted S, as defined herein. For example, the ability of oil to spread on the surface of a water droplet can be characterized by a spreading parameter that can be written as:

$$S = \gamma - (\gamma_{oil} + \gamma_{oil/water})$$

where γ is the surface tension at the water-vapor interface, $\gamma_{oil}$ is the surface tension at the oil-vapor interface, and $\gamma_{oil/water}$ is the surface tension at the oil-water interface.

The sign of S determines whether or not the liquid completely wets the surface. When S is non-negative, the liquid wets the surface and spreads over the substrate. When S is negative the liquid partially wets the surface, and forms a cap on the surface. In the above example of water on an oil surface, a non-negative value of S describes a state in which the oil spreads over the water droplet thus forming a coating layer over the water droplet.

As discussed herein in detail (particularly in the Examples section below), it was found by the present inventors that when S is larger than 0 mJ/m², the apparent contact angle θ* of a liquid droplet on a surface of a substance, can be predicted using the following equation:

$$\cos\theta^* = \frac{\gamma_{oil} - \gamma_{oil/water}}{\gamma_{oil} + \gamma_{oil/water}}$$

According to another aspect of embodiments of the invention, there is provided a method of predicting an apparent contact angle of a liquid droplet on a surface of a substance, the method comprising:

receiving by an electronic device a first surface tension characterizing an interface between the substance and a gas contacting the surface, and a second surface tension characterizing an interface between the substance and the liquid;

calculating by electronic device a ratio between a first function having a first linear combination of the surface tensions and a second function having a second linear combination of the surface tensions; and calculating by electronic device the apparent contact angle of the liquid droplet on the surface based at least in part on the calculated ratio.

In some embodiments, the liquid is an aqueous liquid, optionally water. In some embodiments, the substance is an oily substance (i.e., a water-immiscible substance).

In some embodiments, a coefficient of the first surface tension in the first linear combination and a coefficient of the second surface tension in the first linear combination are at opposite signs.

In some embodiments, a coefficient of the first surface tension in the second linear combination and a coefficient of the second surface tension in the second linear combination are at equal signs.

In some embodiments, the second linear combination comprises an additional term corresponding to a disjoining pressure characterizing a contact between the liquid and the substance. Equation 9 herein below is an exemplary equation which may optionally be used in such an embodiments.

In some embodiments, the apparent contact angle is an arc cosine of the ratio.

In some embodiments, the method is utilized for determining an effect of a treatment (e.g., a plasma treatment according to any of the respective embodiments described herein) on a surface tension, for example, by comparing a predicted apparent contact angle with an experimentally determined contact angle.

In some embodiments, the method is utilized for predicting an effect of a treatment (e.g., a plasma treatment according to any of the respective embodiments described herein) on an apparent contact angle, for example, by extrapolating results obtained from one or more other different treatments (e.g., one or more treatments differing in duration and/or other treatment parameters).

Miscellaneous Definitions:

The term "alkyl" describes a saturated aliphatic hydrocarbon end group, as this term is defined hereinabove, including straight chain and branched chain end groups. Preferably, the alkyl group has 1 to 20 carbon atoms. More preferably, the alkyl is a medium size alkyl having 1 to 10 carbon atoms. Most preferably, unless otherwise indicated, the alkyl is a lower alkyl having 1 to 4 carbon atoms. The alkyl group may be substituted or unsubstituted.

The term "alkylene" describes a saturated aliphatic hydrocarbon linking group, as this term is defined hereinabove, including straight chain and branched chain linking groups. Preferably, the alkylene group has 1 to 20 carbon atoms. More preferably, the alkyl is a medium size alkylene having 1 to 10 carbon atoms. Most preferably, unless otherwise indicated, the alkylene is a lower alkyl having 1 to 4 carbon atoms. The alkyl group may be substituted or unsubstituted.

Substituted alkyl and/or alkylene may have one or more substituents, whereby each substituent group can independently be, for example, alkenyl, alkynyl, cycloalkyl, aryl, heteroaryl, heteroalicyclic, halo, hydroxy, alkoxy, aryloxy, thiohydroxy, thioalkoxy, thioaryloxy, sulfinyl, sulfonyl, cyano, nitro, azide, phosphonyl, phosphinyl, oxo, carbonyl, thiocarbonyl, urea, thiourea, O-carbamyl, N-carbamyl, O-thiocarbamyl, N-thiocarbamyl, C-amido, N-amido, C-carboxy, O-carboxy, sulfonamido, and amino.

As used herein throughout, the term "alkenyl" refers to an unsaturated aliphatic hydrocarbon having one or more carbon-carbon double bonds, including straight chain and branched chain groups. Preferably, the alkenyl group has 2 to 20 carbon atoms. More preferably, the alkenyl is a medium size alkyl having 2 to 10 carbon atoms. Most preferably, unless otherwise indicated, the alkenyl is a lower alkenyl having 2 to 4 carbon atoms. The alkenyl group may be substituted or unsubstituted. When substituted, the substituent group can be, for example, alkynyl, cycloalkyl, aryl, heteroaryl, heteroalicyclic, halo, hydroxy, alkoxy, aryloxy, thiohydroxy, thioalkoxy, thioaryloxy, sulfinyl, sulfonyl, cyano, nitro, azide, phosphonyl, phosphinyl, oxo, carbonyl, thiocarbonyl, urea, thiourea, O-carbamyl, N-carbamyl, O-thiocarbamyl, N-thiocarbamyl, C-amido, N-amido, C-carboxy, O-carboxy, sulfonamido, and amino, as these terms are defined herein.

As used herein throughout, the term "alkynyl" refers to an unsaturated aliphatic hydrocarbon having one or more carbon-carbon triple bonds, including straight chain and branched chain groups. Preferably, the alkynyl group has 2 to 20 carbon atoms. More preferably, the alkynyl is a medium size alkyl having 2 to 10 carbon atoms. Most preferably, unless otherwise indicated, the alkynyl is a lower alkynyl having 2 to 4 carbon atoms. The alkynyl group may be substituted or unsubstituted. When substituted, the substituent group can be, for example, alkenyl, cycloalkyl, aryl, heteroaryl, heteroalicyclic, halo, hydroxy, alkoxy, aryloxy, thiohydroxy, thioalkoxy, thioaryloxy, sulfinyl, sulfonyl, cyano, nitro, azide, phosphonyl, phosphinyl, oxo, carbonyl, thiocarbonyl, urea, thiourea, O-carbamyl, N-carbamyl, O-thiocarbamyl, N-thiocarbamyl, C-amido, N-amido, C-carboxy, O-carboxy, sulfonamido, and amino, as these terms are defined herein.

Herein, the phrase "linking group" describes a group (a substituent) that is attached to two or more moieties in the compound.

Herein, the phrase "end group" describes a group (a substituent) that is attached to a single moiety in the compound via one atom thereof.

The term "aryl" describes an all-carbon monocyclic or fused-ring polycyclic (i.e., rings which share adjacent pairs of carbon atoms) groups having a completely conjugated pi-electron system. The aryl group may be substituted or unsubstituted. Substituted aryl may have one or more substituents, whereby each substituent group can independently be, for example, alkyl, alkenyl, alkynyl, cycloalkyl, aryl, heteroaryl, heteroalicyclic, halo, hydroxy, alkoxy, aryloxy, thiohydroxy, thioalkoxy, thioaryloxy, sulfinyl, sulfonyl, cyano, nitro, azide, phosphonyl, phosphinyl, oxo, carbonyl, thiocarbonyl, urea, thiourea, O-carbamyl, N-carbamyl, O-thiocarbamyl, N-thiocarbamyl, C-amido, N-amido, C-carboxy, O-carboxy, sulfonamido, and amino. The aryl group can be an end group, as this term is defined hereinabove, wherein it is attached to a single adjacent atom, or a linking group, as this term is defined hereinabove, connecting two or more moieties.

A "cycloalkyl" group refers to a saturated on unsaturated all-carbon monocyclic or fused ring (i.e., rings which share an adjacent pair of carbon atoms) group wherein one of more of the rings does not have a completely conjugated pi-electron system. Examples, without limitation, of cycloalkyl groups are cyclopropane, cyclobutane, cyclopentane, cyclopentene, cyclohexane, cyclohexadiene, cycloheptane, cycloheptatriene, decalin and adamantane. A cycloalkyl group may be substituted or unsubstituted. When substituted, the substituent group can be, for example, alkyl, alkenyl, alkynyl, aryl, heteroaryl, heteroalicyclic, halo, hydroxy, alkoxy, aryloxy, thiohydroxy, thioalkoxy, thioaryloxy, sulfinyl, sulfonyl, cyano, nitro, azide, phosphonyl, phosphinyl, oxo, carbonyl, thiocarbonyl, urea, thiourea, O-carbamyl, N-carbamyl, O-thiocarbamyl, N-thiocarbamyl, C-amido, N-amido, C-carboxy, O-carboxy, sulfonamido, and amino, as these terms are defined herein. When a cycloalkyl group is unsaturated, it may comprise at least one carbon-carbon double bond and/or at least one carbon-carbon triple bond.

A "heteroaryl" group refers to a monocyclic or fused ring (i.e., rings which share an adjacent pair of atoms) group having in the ring(s) one or more atoms, such as, for example, nitrogen, oxygen and sulfur and, in addition, having a completely conjugated pi-electron system. Examples, without limitation, of heteroaryl groups include pyrrole, furan, thiophene, imidazole, oxazole, thiazole, pyrazole, pyridine, pyrimidine, quinoline, isoquinoline and purine. The heteroaryl group may be substituted or unsubstituted. When substituted, the substituent group can be, for example, alkyl, alkenyl, alkynyl, cycloalkyl, aryl, heteroaryl, heteroalicyclic, halo, hydroxy, alkoxy, aryloxy, thiohydroxy, thioalkoxy, thioaryloxy, sulfinyl, sulfonyl, cyano, nitro, azide, phosphonyl, phosphinyl, oxo, carbonyl, thiocarbonyl, urea, thiourea, O-carbamyl, N-carbamyl, O-thiocarbamyl, N-thiocarbamyl, C-amido, N-amido, C-carboxy, O-carboxy, sulfonamido, and amino, as these terms are defined herein.

A "heteroalicyclic" group refers to a monocyclic or fused ring group having in the ring(s) one or more atoms such as nitrogen, oxygen and sulfur. The rings may also have one or more double bonds. However, the rings do not have a completely conjugated pi-electron system. The heteroalicyclic may be substituted or unsubstituted. When substituted, the substituted group can be, for example, alkyl, alkenyl, alkynyl, cycloalkyl, aryl, heteroaryl, heteroalicyclic, halo, hydroxy, alkoxy, aryloxy, thiohydroxy, thioalkoxy, thioaryloxy, sulfinyl, sulfonyl, cyano, nitro, azide, phosphonyl, phosphinyl, oxo, carbonyl, thiocarbonyl, urea, thiourea, O-carbamyl, N-carbamyl, O-thiocarbamyl, N-thiocarbamyl, C-amido, N-amido, C-carboxy, O-carboxy, sulfonamido, and amino, as these terms are defined herein. Representative examples are piperidine, piperazine, tetrahydrofuran, tetrahydropyran, morpholine and the like.

Herein, the terms "amine" and "amino" each refer to either a —NR'R" group or a —N$^+$R'R"R'" group, wherein R', R" and R'" can each be hydrogen or a saturated or unsaturated hydrocarbon moiety, as defined herein. When substituted, the carbon atom of R' and/or R" which is bound to the nitrogen atom of the amine is not substituted by oxo, such that R' and R" are not (for example) carbonyl, C-carboxy or amide, as these groups are defined herein. Optionally, R', R" and R'" are hydrogen or alkyl comprising 1 to 4 carbon atoms. Optionally, R' and R" are hydrogen.

An "azide" group refers to a —N=N$^+$=N$^-$ group.

An "alkoxy" group refers to both an —O-alkyl and an —O-cycloalkyl group, as defined herein.

An "aryloxy" group refers to both an —O-aryl and an —O-heteroaryl group, as defined herein.

A "thiohydroxy" or "thiol" group refers to a —SH group.

A "thioalkoxy" group refers to both an —S-alkyl group, and an —S-cycloalkyl group, as defined herein.

A "thioaryloxy" group refers to both an —S-aryl and an 'S-heteroaryl group, as defined herein.

A "carbonyl" or "acyl" group refers to a —C(=O)—R' group, where R' is defined as hereinabove.

A "thiocarbonyl" group refers to a —C(=S)—R' group, where R' is as defined herein.

A "C-carboxy" group refers to a —C(=O)—O—R' groups, where R' is as defined herein.

An "O-carboxy" group refers to an R'C(=O)—O— group, where R' is as defined herein.

An "oxo" group refers to a =O group.

A "halo" group refers to fluorine, chlorine, bromine or iodine.

A "sulfinyl" group refers to an —S(=O)—R' group, where R' is as defined herein.

A "sulfonyl" group refers to an —S(=O)$_2$—R' group, where R' is as defined herein.

A "sulfonate" group refers to an —S(=O)$_2$—O—R' group, where R' is as defined herein.

A "sulfate" group refers to an —O—S(=O)$_2$—O—R' group, where R' is as defined as herein.

A "sulfonamide" or "sulfonamido" group encompasses both S-sulfonamido and N-sulfonamido groups, as defined herein.

An "S-sulfonamido" group refers to a —S(=O)$_2$—NR'R" group, with each of R' and R" as defined herein.

An "N-sulfonamido" group refers to an R'S(=O)$_2$—NR" group, where each of R' and R" is as defined herein.

An "O-carbamyl" group refers to an —OC(=O)—NR'R" group, where each of R' and R" is as defined herein.

An "N-carbamyl" group refers to an R'OC(=O)—NR"- group, where each of R' and R" is as defined herein.

A "carbamyl" or "carbamate" group encompasses O-carbamyl and N-carbamyl groups.

An "O-thiocarbamyl" group refers to an —OC(=S)—NR'R" group, where each to of R' and R" is as defined herein.

An "N-thiocarbamyl" group refers to an R'OC(=S)NR"— group, where each of R' and R" is as defined herein.

A "thiocarbamyl" or "thiocarbamate" group encompasses O-thiocarbamyl and N-thiocarbamyl groups.

An "amide" or "amido" group refers to a C-amido group or an N-amido group, as defined herein.

A "C-amido" group refers to a —C(=O)—NR'R" group, where each of R' and R" is as defined herein.

An "N-amido" group refers to an R'C(=O)—NR' group, where each of R' and R" is as defined herein.

A "urea" group refers to an —N(R')—C(=O)—NR"R'" group, where each of R', R" and R'" is as defined herein.

A "nitro" group refers to an —NO$_2$ group.

A "cyano" group refers to a —C≡N group.

The term "phosphonyl" or "phosphonate" describes a —P(=O)(OR')(OR") group, with R' and R" as defined hereinabove.

The term "phosphate" describes an —O—P(=O)(OR')(OR") group, with each of R' and R" as defined hereinabove.

The term "phosphinyl" describes a —PR'R" group, with each of R' and R" as defined hereinabove.

The term "thiourea" describes a —N(R')—C(=S)—NR"R'" group, where each of R', R" and R" is as defined herein.

It is expected that during the life of a patent maturing from this application many relevant techniques of generating plasma and of exposing a substance's surface to plasma will be developed and the scope of the term "plasma treatment" is intended to include all such new technologies a priori.

As used herein the term "about" refers to ±10% or ±5%.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween. As used herein the term "method" refers to manners, means, techniques and procedures for accomplishing a given task including, but not limited to, those manners, means, techniques and procedures either known to, or readily developed from known manners, means, techniques and procedures by practitioners of the chemical, pharmacological, biological, biochemical and medical arts.

It is appreciated that certain features of the invention, which are, for clarity, described in the context of separate embodiments, may also be provided in combination in a single embodiment. Conversely, various features of the invention, which are, for brevity, described in the context of a single embodiment, may also be to provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental, including calculated, support in the following examples.

EXAMPLES

Reference is now made to the following examples, which together with the above descriptions illustrate some embodiments of the invention in a non-limiting fashion.

Materials and Methods

Liquid polydimethylsiloxane (PDMS) oils with molecular masses of 5,600, 17,500 and 24,000 grams/mol were obtained from Aldrich. The oils are denoted respectively as PDMS1, PDMS2 and PDMS3.

Polycarbonate (PC) (granular) was obtained from Bayer, Makrolon.

Polypropylene (PP) (extruded film) was obtained from a known vendor.

Scanning electron microscopy (SEM) was performed using a JSM-6510 LV device.

Atomic force measurements (AFM) were performed using a 5 M scanning probe microscope, (Park Scientific Instruments).

Contact angles were determined using a Ramé-Hart goniometer (model 500).

Plasma was generated using a PDC-3 XG Plasma Cleaner (Harrick Plasma).

Example 1

Exposing Liquid Polydimethylsiloxane to Low-Pressure Plasma

Sample Preparation:

Aluminum foil was coated with honeycomb polycarbonate (PC) film, using a fast dip-coating process in a humid environment to obtain a "breath-figures" self-assembly pattern. The Honeycomb PC coating was obtained according to the to procedure described in E. Bormashenko et al., Polym. Adv. Technol. 16 (2005) 299-304 and E. Bormashenko et al., Macromol. Chem. Phys. 209 (2008) 567-576, which are incorporated by reference as if fully set forth herein. The average pore radius was established by AFM to be about 1.5 µm and an average pore depth about 1 µm. The tested liquid polydimethylsiloxane (PDMS) oil was deposited onto the PC porous coating and the thickness of the PDMS layer was established by weighing to be 20±2 µm. An exemplary preparation is depicted in FIGS. 4A and 4B.

Accurate establishment of the APCA in the case of liquid polymers is not trivial as it has been shown that a water droplet placed on silicone oil is engulfed by the oil. FIG. 5 presents a schematic illustration of this phenomenon. Measurement of APCE is complicated by the formation of "wetting ridges" at the water/vapor interface of the contact line, as depicted in FIG. 5 and discussed in detail in D. Smith et al., Soft Matter 9 (2013) 1772-1780; S. Anand et al., ACS Nano 6 (2012)10122-10129; and E. Bormashenko et al., Appl. Phys. Lett. 104 (2014) 171601, which are incorporated by reference as if fully set forth herein.

It was observed that thinner silicone oils resulted in smaller wetting ridges. The experimental procedure described hereinabove, wherein a silicone layer having a thickness of about 20 μm was deposited onto the coated porous PC substrates, resulted in negligible wetting ridges, thereby allowing accurate building of a tangent line within a traditional goniometric procedure.

Plasma Treatment:

The PDMS layers were exposed for 30 seconds at ambient temperature to a radio frequency of 13 MHz inductive air plasma discharge, at a pressure of 133 Pa and a power of 18 W. The details of the experimental setup are described in E. Bormashenko et al., Colloids Surf. B92 (2012) 367-371, which is incorporated by reference as if fully set forth herein, as depicted in FIG. 1.

Sample Measurements:

Hydrophilicity (or surface tension) of the PDMS samples was determined by measuring the apparent contact angle (APCA) using a goniometer (Ramé-Hart goniometer model 500-F1). Initial "as placed" APCA measurements were performed immediately after treatment. Thereafter, consecutive APCA measurements were taken every few minutes (at the indicated time points) for the first 2 hours following to plasma treatment to determine the level of hydrophobic recovery of the samples.

The experiments were carried out three times for each of the tested PDMS oils and APCA measurements were performed on treated and untreated PDMS samples.

Experimental Results and Analysis:

Effect of Plasma Treatment on Apparent Contact Angles of PDMS:

As shown in Table 1 and in FIGS. 6A and 6B, the initial ("as placed") apparent water contact angle (APCA) of liquid silicone oil (PDMS) following cold air plasma treatment was considerably lower than the initial ("as placed") APCA of the untreated silicone oil, indicating that the surface of silicone oils was hydrophilized by the plasma treatment.

TABLE 1

Effect of plasma treatment on apparent water contact angles (APCA) of polydimethylsiloxane (PDMS) oils

| Oil | APCA of non-treated oil | APCA of plasma-treated oil |
|---|---|---|
| PDMS1 (5.6 kDa) | 89° ± 1° | 2° ± 1° |
| PDMS2 (17.5 kDa) | 103° ± 1° | 8° ± 1° |
| PDMS3 (24 kDa) | 101° ± 1° | 10° ± 1° |

The results indicate that plasma treatment significantly increases surface energies of organic liquids.

In light of the fact that the PDMS droplet volume is on the microscale, it is noteworthy that the experimental scattering of APCAs was low. Previous studies (Yuehua Yuan, T. Randall Lee, Springer Surface Science Techniques 51(2013) 3-34 and A. Checco et al., Phys. Rev. Lett. 91(2003) 186101, which are incorporated by reference as if fully set forth herein) show that while the contact angles of macroscale water droplets are larger than those of microscale water droplets, the scatter in the values of the microscale contact angles is larger than those of the macroscale contact angles.

As depicted schematically in FIG. 5 (and discussed hereinabove), it has been shown that a water droplet placed on silicone oil is engulfed by the oil.

The coating of the water droplet by the silicone oil (PDMS) was observed experimentally. For the purposes of visualization the orange pigment 4-(phenyldiazenyl)benzenamine (acid yellow 9), which is soluble in PDMS but insoluble in water, was added to the PDMS oils.

As shown in FIGS. 7A and 7B, the water droplet placed on the liquid PDMS layer, was colored orange when the PDMS included orange pigment, indicating that the water droplet was coated by PDMS, as depicted schematically in FIG. 5.

The wetting phenomenon, where the water droplet is engulfed by oil, can be explained by analysis of the spreading parameter S as shown in Equation 1.

$$S=\gamma-(\gamma_{oil}+\gamma_{oil/water}) \quad (1)$$

wherein $\gamma$, $\gamma_{oil}$ and $\gamma_{oil/water}$ represent interfacial tension at water/vapor, oil/vapor and oil/water interfaces respectively.

As a general rule and without being bound by any particular theory, it is established that when the value of S is larger than zero, the water droplet placed on the oil surface is expected to be engulfed by it.

The interface tension parameters of PDMS oils as known in the art are as follows: $\gamma=70$ mJ/m$^2$, $\gamma_{oil}=20$ mJ/m$^2$, $\gamma_{oil/water}=23$-24 mJ/m$^2$ [Kanellopoulos & Owen, Trans Faraday Soc 1971, 67:3127-3138].

Substituting the aforementioned parameters into Equation 1 results in an S value that is larger than zero (S>0), a value consistent with the observation of the PDMS oil coating the water droplet.

Hydrophobic Recovery:

The hydrophilization of the PDMS by plasma treatment was followed by hydrophobic recovery, namely, following the plasma treatment and the consequent decrease in APCA, the APCA thereafter gradually increased with time.

Without being bound by any particular theory, it is believed that the pronounced hydrophilization of PDMS oils is partially linked to the re-orientation of hydrophilic groups of PDMS at the PDMS/air interface. Thus, thermal agitation of the hydrophilic groups results in loss of hydrophilicity and leads to the observed hydrophobic recovery.

Consecutive APCA measurements were taken at various times following plasma treatment, as described in the Materials and Methods section hereinabove, to determine the level of hydrophobic recovery of the samples during the 48 hours following the plasma treatment. The kinetics of hydrophobic recovery is shown in FIG. 8.

Time dependencies of the APCA were approximated by empirical Equation 2:

$$\theta^*(t)=\theta'(1-e^{-t/\tau})+\theta_0=\theta_{sat}-\theta'e^{-t/\tau} \quad (2)$$

where $\theta_0$ corresponds to the initial APCA established immediately after the plasma treatment, $\tau$ is the characteristic time of restoring the contact angle, $\theta'$ is the fitting parameter, and $\theta_{sat}=\theta'+\theta_0$ corresponds to the saturation contact angle, as calculated by fitting of the experimental data with Equation 2.

The calculated characteristic times of hydrophobic recovery for the various PDMS oils are summarized in Table 2.

TABLE 2

Hydrophobic recovery time (τ) vs. molecular mass of PDMS oils

| PDMS Molecular Mass | τ (minutes) |
|---|---|
| 24 kDa | 90.9 |
| 17.5 kDa | 37.0 |
| 5.6 kDa | 17.5 |

The results indicate that the characteristic time of hydrophobic recovery τ is directly correlated to the molecular mass of the liquid.

Without being bound by any particular theory, it is believed that the contact angle of a water droplet on the liquid polymer surface depends on whether a hydrophilic moiety of the liquid polymer molecule is oriented towards the liquid/air interface or towards the bulk of the liquid, and not only on the hydrophilicity of the molecule, similarly to the dependence of contact angle for solid polymers on orientation of the hydrophilic moiety, as previously reported by Yasuda et al. J. Polym. Sci. 19 (1981)1285-1291, which is incorporated by reference as if fully set forth to herein. It is further believed that the abovementioned correlation of time of hydrophobic recovery to molecular mass is due to the fact that shorter polymer chains have less moment inertia of rotation and longer polymer chains will unfold more slowly.

The kinetics of hydrophobic recovery observed for the PDMS oils tested, compares with the kinetics of the variation of adhesion force at liquid/solid interfaces recently reported in R. Tadmor et al., Phys. Rev. Lett. 103 (2009) 266101 and Soft Matter 7 (2011)1577-1580, which are incorporated by reference as if fully set forth herein. In addition, the characteristic time to recovery reported for liquid/solid interfaces, coincides quantitatively with the findings reported herein. However, the characteristic time of hydrophobic recovery established for PDMS liquids is shorter than that observed for solid polymers, which is consistent with the change in hydrophilicity being associated with molecular reorientation of polymer chains, as the mobility of polymer chains in a liquid state is higher than in a solid state.

Interpretation of the Apparent Contact Angles for Water/Liquid PDMS Systems:

The thermodynamic approach used to establish the APCA of the PDMS oils is the implementation of the transversality conditions of the appropriate variational problem of wetting.

When a water droplet is deposited onto the PDMS layer as described in FIG. 5, its free energy G (considering that the energy of the "wetting ridge" is negligible) could be written as shown in Equation 3:

$$G[h(x, y)] = \iint_S \left[ (\gamma_{oil} + \gamma_{oil/water} + P(e))\sqrt{1 + (\nabla h)^2} + (\gamma_{oil/water} - \gamma_{oil}) \right] dx dy, \quad (3)$$

where $\gamma_{oil}$ is the oil/air interfacial tension, e is the thickness of the PDMS liquid layer coating a water droplet, h(x,y) is the local height of the liquid surface above the point (x, y) of the substrate and the integral is extended over the wetted PC-film (substrate) area (considering that latently, there is no difference between surface tensions and surface energies for $\gamma_{oil}$ and $\gamma_{oil/water}$). The first term of the integrand presents the capillary energy of the liquid "composite" cap, and the second term describes the change in the energy of the lower PDMS layer which does not engulf the oil droplet covered by water; and P(e) is the term resulting from the disjoining pressure π(e):

$$\Pi(e) = -\frac{dP}{de} \quad (4)$$

Gravity is neglected, because it has no influence on the APCA. Restriction by an axially symmetric "composite" droplet, leads to the free energy 'G' given by Equation 4:

$$G(h,h') = \int_0^a [2\pi(\gamma_{oil} + \gamma_{oil/water} + P(e))x\sqrt{1+h'^2} + 2\pi x(\gamma_{oil/water} - \gamma_{oil})]dx, \quad (5)$$

Where 'a' is the contact radius of the droplet and no evaporation occurs with PDMS; thus the condition of the constant volume 'V' is represented by Equation 6:

$$V = \int_0^a 2\pi x h(x) dx = \text{const.} \quad (6)$$

Equation 6 is reduced to the minimization of the functional:

$$G(h,h') = \int_0^a \tilde{G}(h, h', x) dx, \quad (7a)$$

$$\tilde{G}(h, h', x) = 2\pi(\gamma_{oil} + \gamma_{oil/water} + P(e))x\sqrt{1+h'^2} + 2\pi x(\gamma_{oil/water} - \gamma_{oil}) + 2\pi\lambda x h. \quad (7b)$$

If the endpoints of the contact line are free to move, the transversality condition at the endpoint a yields:

$$(\tilde{G} - h' \tilde{G}'_{h'})_{x=a} = 0, \quad (8)$$

where $\tilde{G}'_{h'}$ denotes the h' derivative of $\tilde{G}$. Minimization of the Functional (7a) and (7b) yields for the apparent contact angle:

$$\cos\theta^* = \frac{\gamma_{oil} - \gamma_{oil/water}}{\gamma_{oil} + \gamma_{oil/water} + P(e)}. \quad (9)$$

Calculation of P(e) depends on the specific function representing the Derjaguin isotherm Π(e), inherent for water/silicone oil systems.

When the effect of disjoining pressure is neglected, the below equation for APCA is obtained:

$$\cos\theta^* = \frac{\gamma_{oil} - \gamma_{oil/water}}{\gamma_{oil} + \gamma_{oil/water}}, \quad (10)$$

Equation 10 may be interpreted in terms of the equilibrium of interfacial forces acting on the unit length of the contact line. Due to the composite nature of the liquid cap in this experiment, the contact line is not a "triple" (three-phase) line.

The applicability of Equation 10 for predicting APCAs was tested by substituting the $\gamma_{oil}$ and $\gamma_{oil/water}$ parameters with their known corresponding values. The APCA values obtained, namely 94°-95° are in agreement with the experimentally obtained values of 89°-103°, indicating that the disjoining pressure P(e), neglected in Equation 10, does not play a crucial role in the APCA.

Example 2

Treatment of Liquids with Atmospheric-Pressure Plasma

A liquid is applied as a thin layer on a surface, optionally as described in Example 1, and is exposed to atmospheric-pressure plasma jet.

Atmospheric-pressure cold plasma is applied using a plurality of plasma jets aligned so as to cover a larger area of the liquid surface. The liquid layer is exposed to for a time period ranging from 0.1 seconds to 600 seconds at a temperature in a range of from 0 to 100° C. The plasma is generated by capacitance DC air plasma discharge. An exemplary set-up is depicted in FIG. 2.

Alternatively, the liquid is placed in a plasma chamber and is exposed to atmospheric-pressure cold plasma for a time period ranging from 0.1 to 600 seconds at a temperature in a range of from 0 to 100° C. The plasma is generated by capacitance air plasma discharge with a power of 0.1-1000 watt.

APCA measurements of the treated and non-treated liquids are performed as exemplified in Example 1. The effect of plasma treatment on hydrophilicity of the oil is determined, optionally as a function of time in order to evaluate hydrophobic recovery.

Example 3

Treatment of Liquid Droplets with Atmospheric-Pressure Plasma

Aerosol droplets of a liquid is generated, optionally using a nebulizer, and the oil droplets are directed into an atmospheric-pressure plasma chamber, as depicted in FIG. 3, as a non-limiting example.

The liquid droplets in the chamber are exposed to plasma for approximately 30 seconds at a temperature in a range of from 0 to 100° C., generated by capacitance air plasma discharge with a power of 0.1-1000 watt.

The effect of plasma on droplets is optionally determined by the comparative measurement of the apparent contact angle of droplets upon contact with a surface (optionally a surface of water, such that the measured contact angle is a water contact angle), before and after the atmospheric-pressure plasma treatment.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method of decreasing a water contact angle and/or increasing a surface energy of a first liquid, the method comprising exposing the first liquid to a plasma treatment, thereby forming a second liquid having a decreased water contact angle and/or an increased surface energy,
   wherein during said plasma treatment, the first liquid has a depth of at least 10 microns and/or the liquid is in a form of droplets suspended in a gas, and
   said first liquid is characterized by a viscosity of no more than 1,000 cP before said plasma treatment.

2. The method according to claim 1, wherein said plasma treatment comprises exposing the first liquid to a low-pressure plasma discharge.

3. The method according to claim 1, wherein said plasma treatment comprises exposing the first liquid to an atmospheric-pressure plasma discharge.

4. The method according to claim 1, wherein said plasma treatment is a cold plasma treatment.

5. The method according to claim 1, wherein said plasma is air plasma.

6. The method according to claim 2, wherein said plasma treatment comprises RF inductive air plasma discharge.

7. The method according to claim 3, wherein said atmospheric-pressure plasma comprises plasma jet.

8. The method according to claim 3, wherein said atmospheric-pressure plasma treatment is performed in a plasma chamber, whereas the first liquid is introduced to said chamber as liquid droplets, whereas said liquid droplets are exposed to said plasma treatment.

9. The method according to claim 1, wherein exposing the first liquid to said plasma treatment is effected from a time period that ranges from about 1 second to about 600 seconds.

10. The method according to claim 1, wherein said first liquid is characterized by a Tm lower than 300° C.

11. The method according to claim 1, wherein said first liquid comprises a polymeric material.

12. The method according to claim 11, wherein said polymeric material comprises an organosilicon polyether.

13. The method of claim 1, wherein said first liquid comprises an oil.

14. A method of decreasing a water contact angle and/or increasing a surface energy of a first liquid, the method comprising exposing the first liquid to a plasma treatment, thereby forming a second liquid having a decreased water contact angle and/or an increased surface energy,
   wherein during said plasma treatment, the first liquid has a depth of at least 1 mm and/or the first liquid is in a form of droplets suspended in a gas.

15. The method according to claim 14, wherein said plasma treatment comprises exposing the first liquid to a low-pressure plasma discharge.

16. The method according to claim 14, wherein said plasma treatment comprises exposing the first liquid to an atmospheric-pressure plasma discharge.

17. The method according to claim 14, wherein said plasma is air plasma.

18. The method according to claim 16, wherein said atmospheric-pressure plasma treatment is performed in a plasma chamber, whereas the first liquid is introduced to said chamber as liquid droplets, whereas said liquid droplets are exposed to said plasma treatment.

19. The method according to claim 14, wherein exposing the first liquid to said plasma treatment is effected from a time period that ranges from about 1 second to about 600 seconds.

20. The method according to claim 14, wherein said first liquid is characterized by a Tm lower than 300° C.

21. The method according to claim 14, wherein said first liquid comprises a polymeric material.

22. The method according to claim 21, wherein said polymeric material comprises an organosilicon polyether.

23. The method of claim 14, wherein said first liquid comprises an oil.

* * * * *